(12) United States Patent
Huibers (10) Patent No.: US 6,838,302 B2
(45) Date of Patent: Jan. 4, 2005

(54) METHOD FOR ADJUSTING A MICRO-MECHANICAL DEVICE

(75) Inventor: Andrew G. Huibers, Palo Alto, CA (US)

(73) Assignee: Reflectivity, Inc, Sunnyvale, CA (US)

( * ) Notice: Subject to any disclaimer, the term of this patent is extended or adjusted under 35 U.S.C. 154(b) by 170 days.

(21) Appl. No.: 10/338,561

(22) Filed: Jan. 7, 2003

(65) Prior Publication Data

US 2003/0134449 A1 Jul. 17, 2003

Related U.S. Application Data

(60) Provisional application No. 60/347,737, filed on Jan. 11, 2002.

(51) Int. Cl.[7] .............................................. H01L 21/00
(52) U.S. Cl. .......................................... 438/48; 438/51
(58) Field of Search ..................................... 438/48–57

(56) References Cited

U.S. PATENT DOCUMENTS 6,448,622 B1 * 9/2002 Franke et al. ............... 257/415

* cited by examiner

Primary Examiner—H. Jey Tsai
(74) Attorney, Agent, or Firm—Gregory R Muir (57) ABSTRACT

A method for making a MEMS device comprises forming a plurality of micromechanical elements on a first substrate; forming circuitry and electrodes on a second substrate, the first and second substrates extending in a plane in X and Y directions; aligning the first and second substrates in the X and Y directions and moving the substrates toward each other in a Z direction and bonding the first and second substrates with a gap therebetween in the Z direction to form an assembly; singulating the assembly into assembly portions; and altering the gap for each assembly portion. Another embodiment involves aligning the first and second substrates in the X and Y directions and moving the substrates toward each other in a Z direction and bonding the first and second substrates with a gap therebetween in the Z direction to form an assembly; actuating and testing the micromechanical elements of the assembly; and altering the gap for each assembly. A further embodiment involves aligning the first and second substrates in the X and Y directions and moving the substrates toward each other in a Z direction and bonding the first and second substrates with a gap therebetween in the Z direction to form an assembly; wherein the micromechanical elements are actuated while bonding of the substrates.

61 Claims, 6 Drawing Sheets

METHOD FOR ADJUSTING A MICRO-MECHANICAL DEVICE

This application claims the benefit of provisional application Ser. No. 60/347,737 filed Jan. 11, 2002.

BACKGROUND OF THE INVENTION

The present invention relates to methods for making micro-mechanical devices and more particularly to methods for making such devices at the wafer and die level. The invention also relates to forming addressing circuitry and MEMS structures on different wafers, and aligning and bonding the wafers together at the wafer level or die level, with a finer gap adjustment performed at the die level. The invention is also directed to bonding while actuating MEMS structures in real time, or alternating bonding and actuation/measurement steps.

The present application is related to the wafer and die level processes disclosed in U.S. patent application Ser. No. 10/005,308 to Patel et al. filed Dec. 3, 2001 and U.S. patent application Ser. No. 60/276,222 to Patel et al. filed Mar. 15, 2001, each incorporated herein by reference. The present application is also related to micromirror arrays as disclosed in U.S. Pat. Nos. 5,835,256 issued Nov. 10, 1998 and U.S. Pat. No. 6,172,797 issued Jan. 9, 2001, both to Huibers et al. and incorporated herein by reference. Also, as with many MEMS processes, MEMS elements are released towards the end of microfabrication process (but in the present invention, preferably prior to assembly and singulation of the wafer substrates), which release can be performed in accordance with the methods disclosed in U.S. Pat. No. 6,290,865 to Patel et al. issued Sep. 18, 2001, as well as U.S. patent applications Ser. No. 09/649,569 to Patel et al. filed Aug. 28, 2000 and No. 60/298,529 to Reid et al. filed Jun. 15, 2001, each of these being incorporated herein by reference.

The operating (actuation) voltages in a micro-mechanical systems (MEMS) based device can be very sensitive to exact position of the moving components. In one application, an electrostatically actuated micro-mirror array device, mirrors are tilted by applying voltages between a movable electrode attached to the mirror, and a fixed non-movable electrode. If the spacing between these electrodes is non-uniform for different micro-mirrors on the device, the resulting operating voltages can be non-uniform. In addition, the dimensions of the flexing member of a MEMS structure (e.g. the hinge) can change the stiffness of the flexing member, and also can be a large contributor to variation in operating voltages.

It would be desirable to develop a manufacturing process which can reduce variation of operating voltages in MEMS devices, either within a chip or within a group of chips.

SUMMARY OF THE INVENTION

A method for making a MEMS device comprises forming a plurality of micromechanical elements on a first substrate; forming circuitry and electrodes on a second substrate, the first and second substrates extending in a plane in X and Y directions; aligning the first and second substrates in the X and Y directions and moving the substrates toward each other in a Z direction and bonding the first and second substrates with a gap therebetween in the Z direction to form an assembly; singulating the assembly into assembly portions; and altering the gap for each assembly portion.

In another embodiment of the invention, a method for making a MEMS device comprises forming a plurality of micromechanical elements on a first substrate; forming circuitry and electrodes on a second substrate, the first and second substrates extending in a plane in X and Y directions; aligning the first and second substrates in the X and Y directions and moving the substrates toward each other in a Z direction and bonding the first and second substrates with a gap therebetween in the Z direction to form an assembly; actuating and testing the micromechanical elements of the assembly; and altering the gap for each assembly.

In a further embodiment of the invention, a method for making a MEMS device comprises forming a plurality of micromechanical elements on a first substrate; forming circuitry and electrodes on a second substrate, the first and second substrates extending in a plane in X and Y directions; aligning the first and second substrates in the X and Y directions and moving the substrates toward each other in a Z direction and bonding the first and second substrates with a gap therebetween in the Z direction to form an assembly; wherein the micromechanical elements are actuated while bonding of the substrates.

DESCRIPTION OF THE PREFERRED EMBODIMENTS

Figure 1:
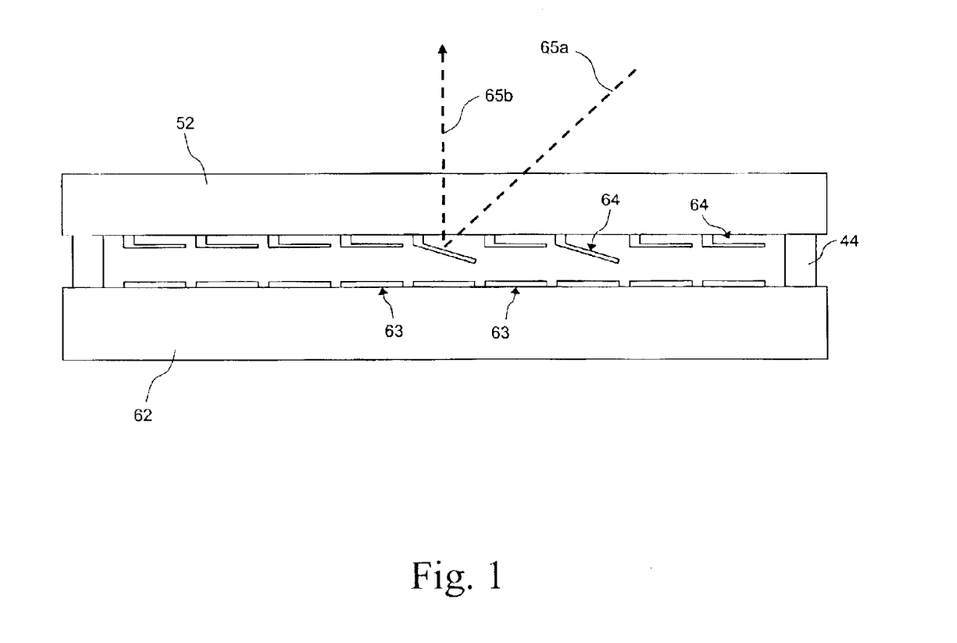
FIG. 1 is a cross section of a double substrate MEMS array.

As an example, a MEMS (micro-mirror) array is fabricated using any suitable method, e.g. methods disclosed in U.S. Pat. Nos. 5,835,256 and 6,046,840. In brief, movable elements (e.g. micro-mirrors 64) are fabricated on a transparent (or light transmissive) wafer 52 and addressing circuitry is formed on a silicon wafer 62 as shown in FIG. 1. The two wafers are then joined to form a spatial light modulator. Electrodes 63 also formed on silicon substrate 62, electrostatically attract the adjacent micro-mirrors. An incoming light beam 65a will be directed away from the spatial light modulator at a different angle (beam 65b) when a micro-mirror is in a deflected position. The MEMS elements need not be micro-mirrors, though it is preferred that the MEMS elements on a first substrate be actuated by circuitry on a second substrate. In another example, the MEMS elements are diaphragms or cantilevers that form a portion of an RF MEMS switch, where circuitry and electrodes on the other substrate pull the diaphragms or cantilevers to close the switch. Regardless of the type of MEMS device, it is desirable that the microstructures on the first substrate be accurately aligned in X, Y and Z directions with the microfabricated structure (e.g. circuitry and electrodes) on the second substrate.

In one embodiment, the two wafers/substrates are joined together using metal compression bond pillars (labeled 44 in FIG. 1). The substrates are aligned in X and Y and the bonds are compressed in Z to within approximately one micron of the final position. The X and Y alignments are approximately fixed (this device is also less sensitive to X, Y variation than Z variations).

Figure 2:
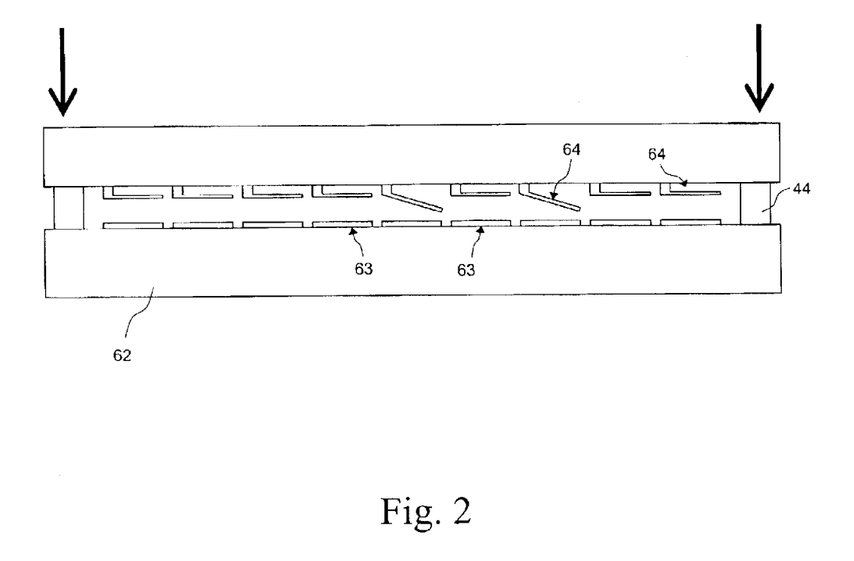
FIG. 2 is an illustration of pressure points for compression bonding of two substrates.

Next, the device is testable and can be actuated. A voltage can be applied between mirrors 64 and electrodes 63. The operating characteristics can thus be determined and the gap between substrates can be further adjusted by additionally compressing pillars 44 by pushing on them as shown in FIG. 2 (pushing is indicated by the dark arrows). The size of the gap can be measured while pushing, as well as the operating characteristics. A gap measurement can be made with a reflectometer (which measures reflectance vs. wavelength). The process can be performed iteratively, alternately compressing pillars (in any sequence) and measuring the resulting operating voltages and/or gap until the desired uniformity are achieved. The pushing process can be easily accomplished with a modified robotic pick-and-place tool such as is widely available and used in the industry.

Figure 3A:
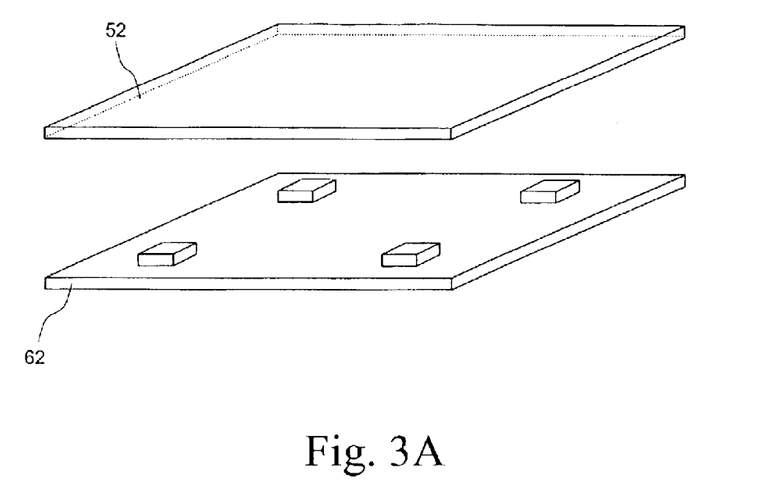
FIGS. 3A and 3B are views showing the application of metal to one of the substrates followed by compression bonding.
Figure 3B:
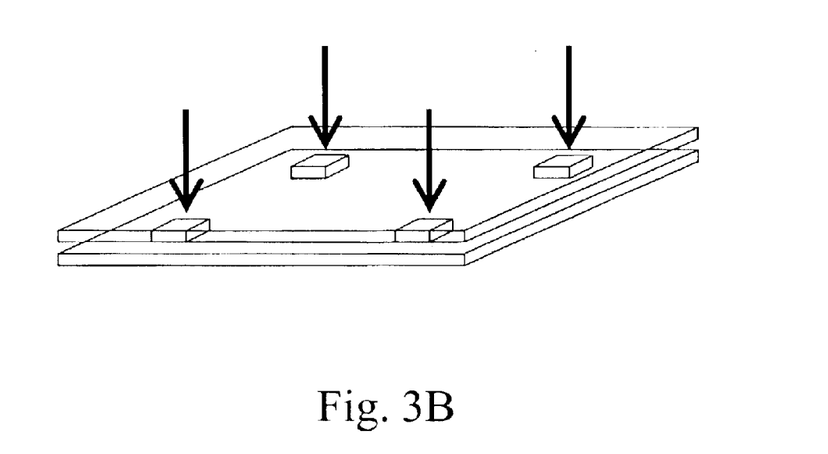
Figure 4A:
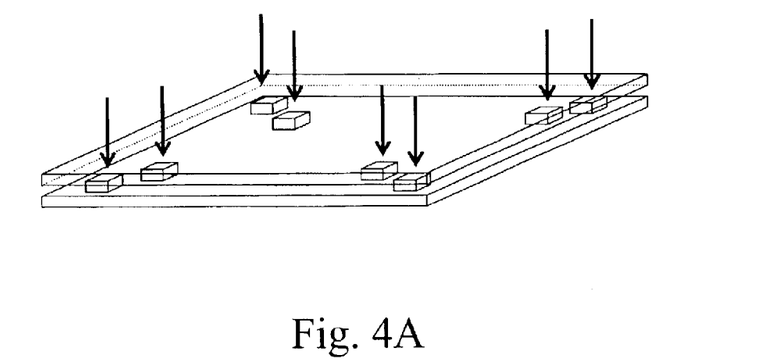
FIGS. 4A and 4B are views showing application of two metal areas in each corner of one of the substrates, followed by compression bonding.
Figure 4B:
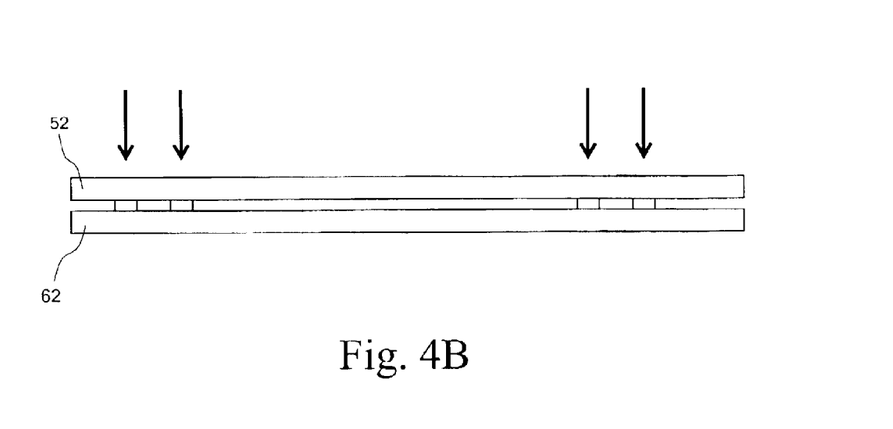

The process is shown in a perspective view in FIGS. 3A and 3B. The substrates are joined together and then the spacers/compression bonds are further compressed until the desired spacing is achieved. The number of the pillars and their location can be changed. For example in FIG. 4A there are two pillars in the corners of the rectangular plate. This allows second order corrections to the Z gap between the substrates (e.g. elimination of a "bulls eye" pattern). Also, the "pillars" can be provided on one or both substrates, and as strips, bands or in other configurations on the substrate(s). In addition, the "pillars" are preferably positioned at edges or corners of each die on the wafer, so that after singulation of the bonded wafer assembly, such pillars will be disposed along a plurality of edges or corners of each die. Spacers can be provided at the time of bonding, or can be microfabricated at the time of forming the MEMS structures or circuitry.

Figure 5:
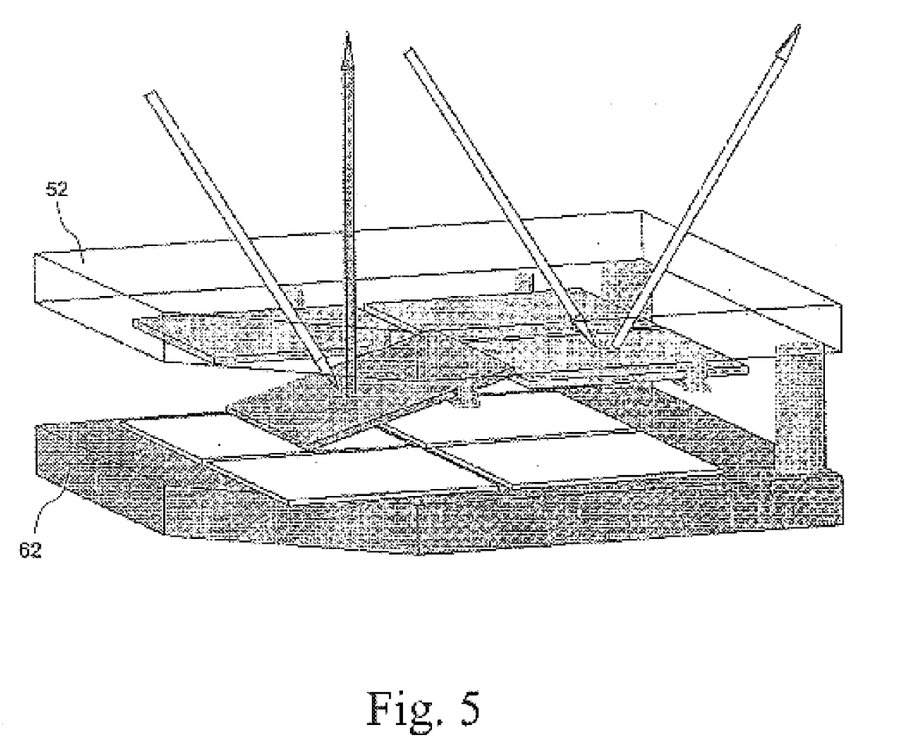
FIG. 5 is an illustration of a micromirror being actuated.
Figure 6A:
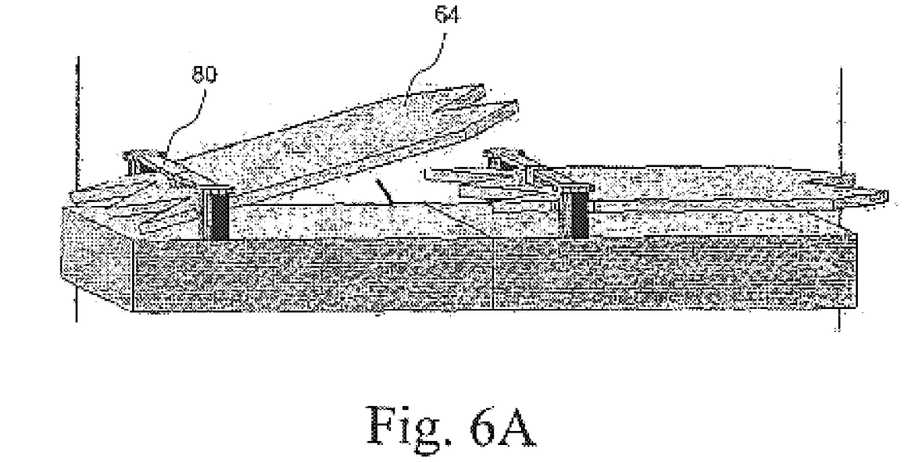
FIGS. 6A and 6B are illustrations of non-square mirrors being actuated.
Figure 6B:
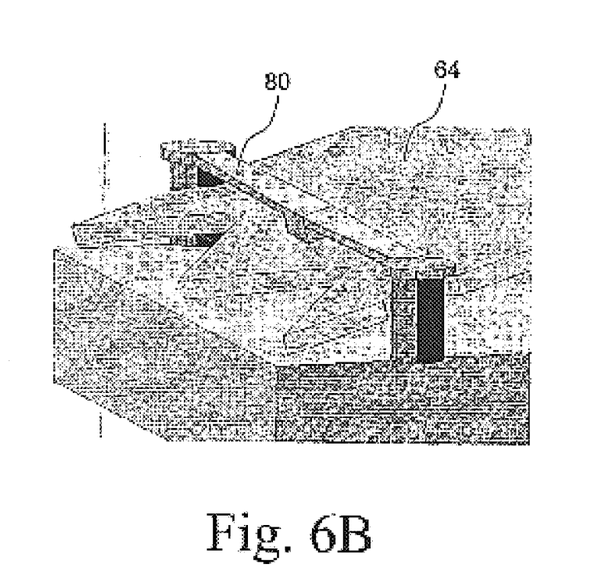

FIG. 5 is an illustration of a micromirror being actuated. FIGS. 6A and 6B are illustrations of non-square mirrors being actuated (mirrors 64 pivotably held to the substrate by a torsion hinge 80). Such mirrors are disclosed in more detail in U.S. patent application Ser. No. 09/732,445 to Ilkov et al. filed Dec. 7, 2000 and incorporated herein by reference.

In the above micro-mirror device, two main sources of operation voltage variation are mirror-to-electrode separation (Z height) and mirror hinge stiffness. The latter can be due to film thickness variation. Typically, the hinge stiffness varies slowly over a wafer or substrate on which many devices are fabricated and thus slowly over an individual device. The manufacturing advantage of the current invention is that first, changes in the gap can be trimmed very accurately to achieve the operating voltage desired. Second, most changes in hinge stiffness that occur over a micromirror device die can be cancelled out by making compensating adjustments to the electrode-mirror spacing. In one embodiment of the invention, the two substrates are aligned in the X and Y directions, and compression bonded to have a gap in the Z direction to within a particular dimension (e.g. 1 or 0.5 um). Then, after singulation of the larger substrate assembly (e.g. wafer assembly) into smaller dies, micromirrors on each die can be tested electrically and/or optically. Such testing can be performed to determine any nonuniformity in actuation voltage across the die. Mapping the actuation nonuniformity, that is, the difference in voltage needed to actuate the micro-mirrors (across the die), can be followed by a second finer gap adjustment that corrects (or at least improves) the nonuniformity. Further alternating testing and gap adjustment steps can be performed to further decrease nonuniformities (in gap or micromechanical device actuation) if desired. In one embodiment, the substrates are bonded with or without concurrent testing of assembly gap, followed by singulation and bonding adjustment. Initial bonding can be performed with optical monitoring of substrate gap, and bonding adjustment can be performed after micromechanical device actuation and testing. Actuation and testing of the micro-mirrors and the second adjustment at the die level can also be performed at the same time where data output from the actuation and testing acts as data input for feedback control of bonding/adjustment in real time.

In an alternate embodiment of the invention, a die assembly or other MEMS assembly is bonded, followed by testing of the assembly, further followed by bonding adjustment (without any singulation step). Additional testing and bonding steps could be performed if desired. The initial bonding could be monitored optically, followed by micromechanical structure actuation and testing and bonding adjustment. Or, the initial bonding could be performed while actuating and testing the micromechanical structures in real time, as above. Also, in any of the embodiments above, the actuation can be binary operation or analog operation, regardless of whether the ultimate MEMS structure will be run in binary or analog mode.

As can be seen from the above, the present invention creates a large manufacturing advantage for a "gap closing" type of electrostatic actuator, in that the pull-in voltage of this device (for which the electrostatic force exceeds the mechanical restoring force for all angles) can be trimmed to be the same (within a small range) across the device using a simple manufacturing operation. The invention also allows for manufacturing advantage for other types of MEMS devices, such as micromirrors or other devices run in analog mode.

Many variations to the above structures and methods are possible. For example, if the method is a multi-step bonding method (initial bonding followed by one or more adjustment steps), in place of metal compression bonding, a polymer that is capable of reversible cross linking (e.g. a thermoplastic homopolymer of copolymer) could be used (including, but not limited to polyethylene, polystyrene, nylons. polycarbonate, polyacetals or polyamide-imides). Or, a polymer could be partially cured initially, followed by bonding adjustment and fully curing in a later stage.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

What is claimed is:

1. A method for making a MEMS device, comprising:
   forming a plurality of micromechanical elements on a first substrate;
   forming circuitry and electrodes on a second substrate, the first and second substrates extending in a plane in X and Y directions;
   aligning the first and second substrates in the X and Y directions and moving the substrates toward each other in a Z direction and bonding the first and second substrates with a gap therebetween in the Z direction to form an assembly;
   singulating the assembly into assembly portions;
   altering the gap for each assembly portion.

2. The method of claim 1, wherein the bonding of the first and second substrates is by metal compression bonding.

3. The method of claim 2, wherein the altering of the gap for each assembly portion is by metal compression bonding.

4. The method of claim 1, wherein the first and second substrates are wafers.

5. The method of claim 4, wherein the first substrate is a wafer transmissive to visible light.

6. The method of claim 5, wherein the first substrate is a glass or quartz wafer.

7. The method of claim 6, wherein the second substrate is a semiconductor wafer.

8. The method of claim 7, wherein the second substrate is a silicon wafer.

9. The method of claim 1, wherein the micromechanical elements are micromirrors.

10. The method of claim 1, wherein the assembly is singulated by scoring and/or sawing.

11. The method of claim 1, wherein the plurality of micromechanical elements are formed by depositing and patterning a sacrificial material on the first substrate, depositing and patterning one or more structural layers on the sacrificial material, and removing the sacrificial material to release the micromechanical elements.

12. The method of claim 1, wherein the bonding of the first and second substrates with a gap therebetween is performed by bonding while optically monitoring the gap.

13. The method of claim 12, wherein the altering of the gap for each assembly portion is performed while monitoring the actuation of the micromechanical elements.

14. The method of claim 12, wherein the altering of the gap for each assembly portion is performed while monitoring the gap between the first and second substrates.

15. The method of claim 14, wherein the monitoring of the gap between the first and second substrates is performed optically.

16. The method of claim 12, wherein the bonding while optically monitoring the gap is metal compression bonding.

17. The method of claim 16, wherein the altering of the gap of each assembly portion is by further metal compression bonding.

18. The method of claim 1, wherein the bonding of the first and second substrates is performed to within 1 micron accuracy.

19. The method of claim 1, wherein the first and second substrates comprise a plurality of die areas, each die area having a plurality of bond areas proximate thereto.

20. The method of claim 19, wherein the bond areas proximate to each die area comprise one or more metal pillars for metal compression bonding.

21. A method for making a MEMS device, comprising:
   forming a plurality of micromechanical elements on a first substrate;
   forming circuitry and electrodes on a second substrate, the first and second substrates extending in a plane in X and Y directions;
   aligning the first and second substrates in the X and Y directions and moving the substrates toward each other in a Z direction and bonding the first and second substrates with a gap therebetween in the Z direction to form an assembly;
   actuating and testing the micromechanical elements of the assembly; and
   altering the gap for each assembly.

22. The method of claim 21, wherein the bonding of the first and second substrates is by metal compression bonding.

23. The method of claim 22, wherein the altering of the gap for each assembly is by application of pressure in one or more areas comprising metal compression bonds.

24. The method of claim 21, wherein the first and second substrates are die portions of wafers.

25. The method of claim 24, wherein the first substrate is a die portion transmissive to visible light.

26. The method of claim 25, wherein the first substrate is a glass or quartz die portion.

27. The method of claim 26, wherein the second substrate is a semiconductor die portion.

28. The method of claim 27, wherein the second substrate is a silicon die portion.

29. The method of claim 21, wherein the micromechanical elements are micromirrors.

30. The method of claim 21, wherein the assembly is substantially rectangular.

31. The method of claim 21, wherein the plurality of micromechanical elements are formed by depositing and patterning a sacrificial material on the first substrate, depositing and patterning one or more structural layers on the sacrificial material, and removing the sacrificial material to release the micromechanical elements.

32. The method of claim 21, wherein the bonding of the first and second substrates with a gap therebetween is performed by bonding while optically monitoring the gap.

33. The method of claim 32, wherein the altering of the gap for each assembly is performed while monitoring the actuation of the micromechanical elements.

34. The method of claim 32, wherein the altering of the gap for each assembly is performed while monitoring the gap between the first and second substrates.

35. The method of claim 34, wherein the monitoring of the gap between the first and second substrates is performed optically.

36. The method of claim 32, wherein the bonding while optically monitoring the gap is metal compression bonding.

37. The method of claim 36, wherein the altering of the gap of each assembly is by further metal compression bonding.

38. The method of claim 21, wherein the bonding of the first and second substrates is performed to within 1 micron accuracy.

39. The method of claim 21, wherein the bonding of the first and second substrates is performed while actuating the micromechanical elements.

40. The method of claim 39, wherein the uniformity of the actuation of the micromechanical elements is measured while during actuation of the micromechanical elements.

41. A method for making a MEMS device, comprising:
   forming a plurality of micromechanical elements on a first substrate;
   forming circuitry and electrodes on a second substrate, the first and second substrates extending in a plane in X and Y directions;
   aligning the first and second substrates in the X and Y directions and moving the substrates toward each other in a Z direction and bonding the first and second substrates with a gap therebetween in the Z direction to form an assembly;
   wherein the micromechanical elements are actuated while bonding of the substrates.

42. The method of claim 41, wherein the bonding of the first and second substrates is by metal compression bonding.

43. The method of claim 42, wherein the actuation of the micromechanical elements is monitored.

44. The method of claim 41, wherein the first and second substrates are die portions of wafers.

45. The method of claim 44, wherein the first substrate is a die portion transmissive to visible light.

46. The method of claim 45, wherein the first substrate is a glass or quartz die portion.

47. The method of claim 46, wherein the second substrate is a semiconductor die portion.

48. The method of claim 47, wherein the second substrate is a silicon die portion.

49. The method of claim 41, wherein the micromechanical elements are micromirrors.

50. The method of claim 41, wherein the assembly is substantially rectangular.

51. The method of claim 41, wherein the plurality of micromechanical elements are formed by depositing and patterning a sacrificial material on the first substrate, depositing and patterning one or more structural layers on the sacrificial material, and removing the sacrificial material to release the micromechanical elements.

52. The method of claim 41, wherein the bonding of the first and second substrates with a gap therebetween is performed by metal compression bonding, and the actuation of the micromechanical elements is electrostatic actuation, and wherein the actuation of the micromechanical elements is monitored in real time so as to alter the bonding based on detected nonuniformities in actuation of the micromechanical elements.

53. The method of claim 52, wherein the altering of the gap for each assembly is performed while monitoring the actuation voltages of the micromechanical elements across the assembly or across a portion of the assembly.

54. The method of claim 52, wherein the altering of the gap for each assembly is performed while monitoring the gap between the first and second substrates and while monitoring the actuation of the micromechanical elements.

55. The method of claim 54, wherein the monitoring of the gap between the first and second substrates is performed optically.

56. The method of claim 52, wherein the first and second substrates are bonded non-parallel to each other in order to compensate for nonuniform actuation voltages across the assembly.

57. The method of claim 41, wherein bonding is automatically altered in response to detected actuation parameters across the assembly.

58. The method of claim 41, wherein the bonding of the first and second substrates is performed to within 1 micron accuracy.

59. The method of claim 41, wherein the bonding of the first and second substrates is performed while electrostatically actuating the micromechanical elements by application of voltages to electrodes on the second substrate.

60. The method of claim 59, wherein the uniformity of the actuation of the micromechanical elements is measured during actuation of the micromechanical elements.

61. A method for making a MEMS device, comprising:
    forming a plurality of micromechanical elements on a first substrate;
    forming circuitry and electrodes on a second substrate, the first and second substrates extending in a plane in X and Y directions;
    aligning the first and second substrates in the X and Y directions and moving the substrates toward each other in a Z direction and bonding the first and second substrates with a gap therebetween in the Z direction to form an assembly;
    discontinuing bonding and measuring the gap across the assembly; and
    altering the gap for each assembly.

* * * * *